United States Patent [19]

Eumurian

[11] 4,262,366
[45] Apr. 14, 1981

[54] SIGNAL-TRANSMITTING SYSTEM INCLUDING AN OPTICAL LIMB WITH AUTOMATIC AMPLITUDE LIMITATION

[75] Inventor: Grégoire Eumurian, Paris, France
[73] Assignee: Thomson-CSF, Paris, France
[21] Appl. No.: 27,858
[22] Filed: Apr. 6, 1979
[30] Foreign Application Priority Data
Apr. 11, 1978 [FR] France ............................... 78 10611
[51] Int. Cl.³ ........................................... H04B 9/00
[52] U.S. Cl. ................... 455/612; 455/613; 455/617; 455/619
[58] Field of Search ............... 250/199; 455/612, 613, 455/617, 619

[56] References Cited

U.S. PATENT DOCUMENTS 3,911,363  10/1975  Patten ................................. 250/199

OTHER PUBLICATIONS

Blackburn, J. C., "A 120 MHz Bandwidth Linear Signal Transmission System Using Fiber Optics", *IEEE Transactions on Instrumentation and Measurement*, vol. IM 24, No. 3, Sep. 1973, pp. 230–232.

*Primary Examiner*—Howard W. Britton
*Attorney, Agent, or Firm*—Karl F. Ross

[57] ABSTRACT

A fiber-optical communication path between a transmitter and a receiver of electrical message signals forms a main channel and a shunt branch terminating at respective photodiodes from which incoming signals can be alternatively fed to an output terminal by way of an adjustable attenuator that is periodically reset, with the aid of a digitally operating automatic-gain-control loop in response to a pilot signal arriving over the same path. A code converter in that loop supplies binary words, representative of signal amplitude, to a comparator which determines whether the amplitude of a signal in the output of the main channel exceeds a given threshold and, in that case, causes a switchover to the shunt branch whose optical attenuation is substantially greater. The periodic emission of a pilot signal in lieu of a message signal is controlled by a setting instruction which, aside from enabling the resetting of the attenuator according to the instantaneous contents of the code converter, is sent to the transmitting end via a further fiber-optical channel in order to command a changeover from one signal source to another.

6 Claims, 3 Drawing Figures

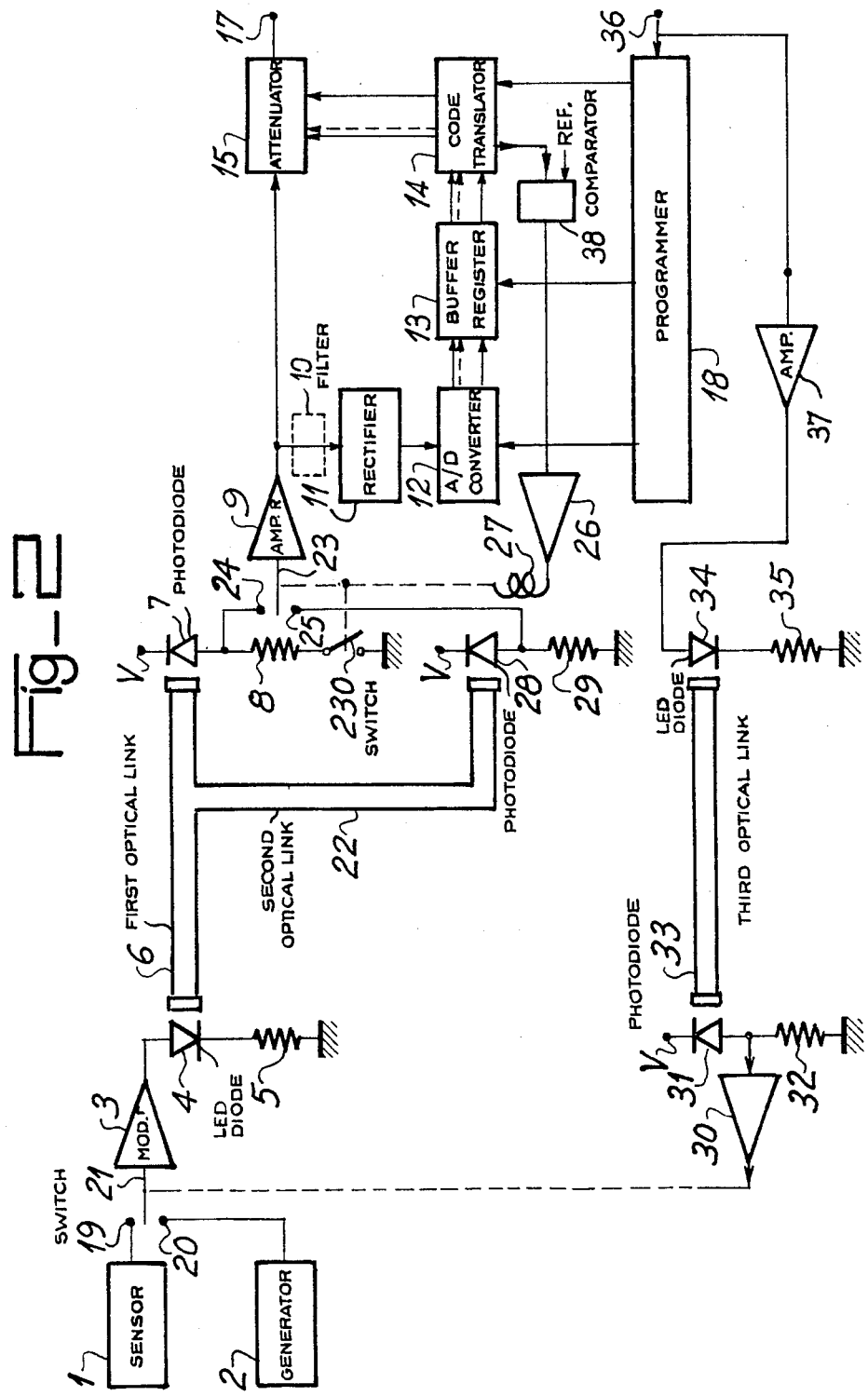

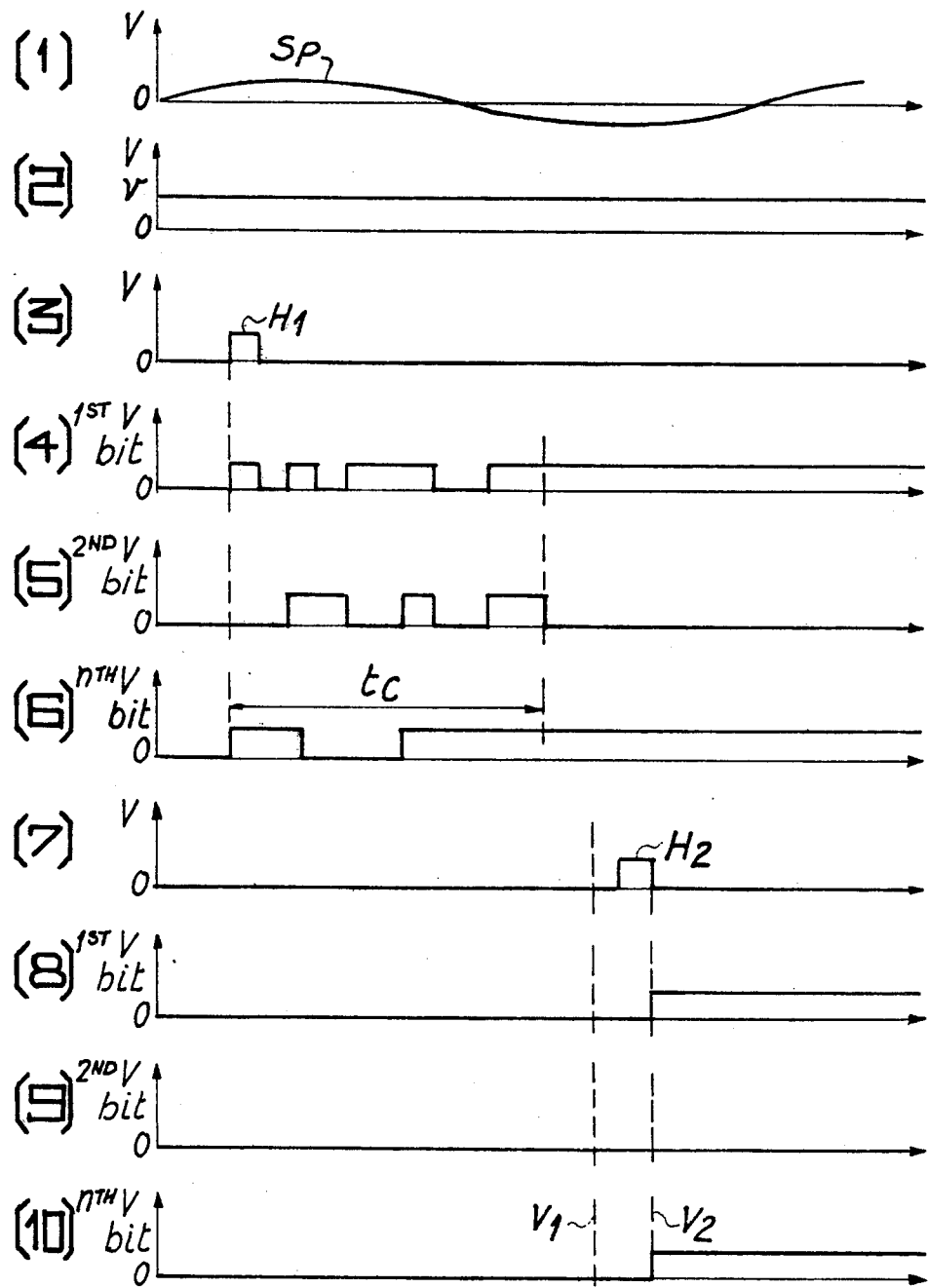

SIGNAL-TRANSMITTING SYSTEM INCLUDING AN OPTICAL LIMB WITH AUTOMATIC AMPLITUDE LIMITATION

FIELD OF THE INVENTION

My present invention relates to a system for transmitting electrical signals, including high-power pulses, via an optical connection to a receiver operating with automatic gain control.

BACKGROUND OF THE INVENTION

There are fields, chiefly that known as high-speed electronics, in which it is necessary to process detected pulsed message signals of very short duration which may recur at equally short intervals and whose initial shape may not be known but which nevertheless must be capable of being reconstituted with a certain degree of accuracy at the time of processing. This may be the case in the transmission of digital signals of the order of a hundred megabits with a very wide frequency band of the order of 500 MHz, for example.

In such transmission systems the received signals are converted into optical signals by means of high-speed optical emitters of the laser-diode type which enable wide-band links to be achieved whose band may range from approximately 100 Megahertz to 1 Gigahertz. The optical links are composed of optical fibers which, in comparison with electrical links, have the advantage of being electrically insulated and having a wide passband. However, such optical-fiber links do have the disadvantage of attenuating transmitted signals to an extent which may vary considerably in the course of transmission. This is due to the fact that the optical connectors employed are extremely sensitive to mechanical tolerances and to dust, and also to the fact that certain optical fibers of the multistrand type may have a varying number of their strands fractured, which attenuate still further the transmitted light. To these changes in level are added the changes caused by the transmitting and receiving members.

The transmitting member is a transducer which receives the signal to be processed from a sensor and converts it into an optical signal. In general, the transmitting member may be a solid-state laser or a light-emitting diode having a conversion characteristic for current to optical intensity which varies with time. The optical receiver which detects the signals transmitted by the fibers forming the optical link between the transmitter and the receiver may use either PIN diodes or avalanche diodes. PIN diodes are stable with temperature and as a function of the bias voltage. Avalanche photodiodes are approximately 100 times more sensitive to light but are extremely susceptible to variations in temperature and voltage.

The disadvantages of transmission systems employing optical links set against the advantages gained by using such links, as reviewed above, means that attention must be paid to the stability of the systems. In these systems, the transmitting and receiving elements are generally stabilized by amplitude-regulating loops. The variations in level which still occur are thus due almost exclusively to the optical links.

In conventional gain-control systems it is necessary to determine the losses suffered by signals in the optical link so as to restore the signal to the level it had on entering the link. The message signal to be processed, which may also be termed a useful signal, has superimposed on it a pilot signal of a predetermined level which lies outside the frequency band of the message signal. Since the attenuation to which the pilot signal is subjected is identical to that undergone by the message signal, it is possible at reception to restore the useful signal to the correct level.

On reception the pilot signal is extracted from the composite signal consisting of the message signal and the pilot signal and after detection controls a digitally operated variable-gain arrangement.

FIG. 1 is a diagram showing a prior-art arrangement of this kind. A sensor 1 receives the useful signal which, generally speaking, is of short duration and unknown level, and transmits it in electrical form to a modulator 3 which receives a pilot signal of fixed shape and amplitude from a source 2. The modulator combines the message signal Su and the pilot signal Sp and emits a composite signal Sc which is applied, for example, to a light-emitting diode 4 in series with a resistor 5. The diode converts the composite electrical signal Sc into an optical signal which is transmitted to the receiving part of the arrangement through an optical link 6. The output of the optical link feeds a receiving transducer, such as a photodiode 7, which is connected between a voltage source +V and ground via a resistor 8 and which again converts the composite optical signal into a composite electrical signal containing the useful signal and the pilot signal. Given that the attenuation undergone by the pilot signal can be assumed to be the same as that undergone by the message signal, the composite signal is applied to a fixed-gain amplifier 9 followed by a digital attenuator 15, this circuitry being connected to an automatic-gain-control arrangement which processes the extracted pilot signal and controls the attenuator in such a way that the message signal, which it emits either alone or still mixed with the pilot signal, is of the requisite level.

Starting from the fixed-gain amplifier 9, the automatic-gain-control arrangement comprises a band-pass filter 10 which separates the pilot signal, a non-clipping rectifier 11 which emits the pilot signal in the form of a D.C. voltage, a multibit analog-to-digital converter 12, the number of bits depending upon the accuracy required, a buffer register 13, and a code converter 14. The latter is connected to the attenuator 15 whose attenuation it adjusts. A high-pass filter 16 connected to the output of the attenuator 15 emits the message signal at an output 17. A timer or programmer 18 is provided to control the converter 12, the buffer register 13 and the code converter 14.

In the case of this prior-art arrangement, it is essential that the pilot or calibrated signal superimposed on the useful signal to produce the composite signal be situated outside the frequency band of the message signal. In many cases, this band extends from frequencies close to zero to frequencies which may be as high as several hundred Megahertz. In the prior art, the frequency of the pilot signal thus had to be set at a very low level, that is to say below the lowest message frequency, or at a very high level above the highest message frequency. In making this selection there was a danger of complicating the electronic circuitry and restricting the frequency band of the message signal either at the top or at the bottom.

The regulation of signal amplitudes by the automatic-gain-control circuit 10–14 associated with amplifier 9 and attenuator 15 in the load circuit of FIG. 1, in response to a pilot signal arriving over the fiber-optical link 6, has no effect upon the intensity of the luminous signal received by a photoelectrical transducer such as photodiode 7. It may therefore happen that this transducer becomes overloaded by large-amplitude optical signals which could have a destructive effect.

OBJECTS OF THE INVENTION

An important object of my present invention, therefore, is to provide a solution to the aforestated problem in a system for conveying message signals from a transmitter to a receiver by way of a communication path including fiber-optical transmission means.

Another object is to provide an improved system of this type in which the pilot signal need not be separated in frequency from the message signal.

SUMMARY OF THE INVENTION

In accordance with my present invention, the fiber-optical transmission means of the communication path includes a main channel extending from an input end to a first output end and a branch channel extending between this input end and a second output end, the branch channel having a higher optical attenuation than the main channel. An emitter of optical signals, which may be alternately connectable to a source of message signals and to a source of pilot signals, confronts the input end of the main fiber-optical channel at the transmitter. The output ends of the main and branch channels are respectively confronted by a first and a second photoelectrical transducer designed to translate the incoming optical signals into electrical signals to be fed to a load circuit of the receiver. A changeover switch connects the load circuit in a normal position to the first transducer and in an off-normal position to the second transducer, this changeover switch being controlled by amplitude-sensing means connected to the load circuit and effective in the normal switch position for establishing the off-normal position upon detecting a signal amplitude exceeding a predetermined reference level.

Advantageously, as more fully described hereinafter, the amplitude-sensing means comprises a comparator to which binary words are fed from a transcoder included along with an analog-to-digit converter in an automatic-gain-control loop of the type hereinabove described with reference to FIG. 1.

BRIEF DESCRIPTION OF THE DRAWING

The above and other features of my invention will become apparent from the following description of an embodiment when read in conjunction with the accompanying drawing in which:

FIG. 2 is a block diagram of a system according to the invention; and

FIG. 3 is a set of graphs with waveforms representing signals at various points in the system of FIG. 2.

SPECIFIC DESCRIPTION

Figure 1:
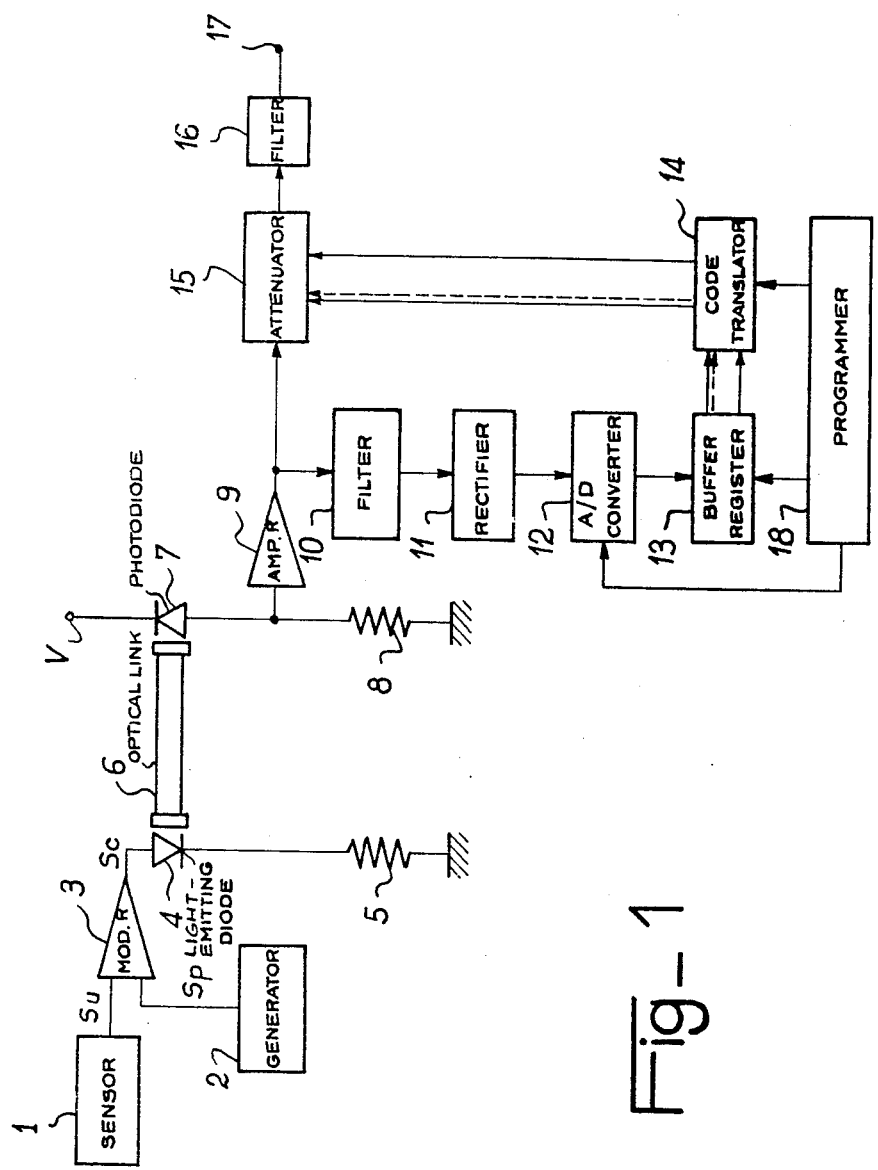
FIG. 1, already discussed, is a block diagram of a conventional signal-transmission system.

FIG. 2 shows an embodiment of a circuit arrangement according to my invention for automatically controlling the gain of a reception channel in a system employing an optical link. As mentioned in the introduction to the present specification, this arrangement is designed to satisfy two criteria, namely to operate when the pilot signal lies in the frequency band of the useful signal associated therewith and also when the useful signal is transmitted with a high energy level.

In FIG. 2 I have used the same references as in FIG. 1 for circuit components which occupy the same position in the arrangement and which perform the same functions.

The arrangement according to the invention comprises a sensor 1 for detecting the phenomenon giving rise to the message signal which it is desired to study, a generator 2 emitting the pilot signal which is associated with the message signal under conditions to be defined below, a modulator 3 which is alternately connectable, via a switch 21 and terminals 19, 20, to the sensor 1 or to the pilot-signal generator 2, and a light-emitting diode (LED) 4 in series with a resistor 5. The useful signal in electrical form which comes from the sensor 1 is applied to the laser diode or LED 4 transmitting luminous energy to an optical linking channel 6, such as an optical fiber of closely defined diameter, whose output is applied to a photodiode 7. The optical fiber 6 has a branch in the form of an optical fiber 22 which extracts a predetermined portion of energy transmitted by the fiber 6. Fiber 22 confronts another photodiode 28.

The outputs of diodes 7 and 28 are connected respectively to terminals 24, 25 of a switch 23 which is connected to a fixed-gain amplifier 9. The latter is connected to a non-clipping rectifier 11 which is followed by an analog-to-digital converter 12 connected to a buffer register 13 and a code translator 14 which in turn supplies a digitally controlled attenuator 15. The latter has another input, connected to the fixed-gain amplifier 9, and an output 17 feeding a load not further illustrated. The code translator 14 also has a special output which, via a comparator 38 and an amplifier 26, feeds a relay coil 27 for the control of the changeover switch 23 and of a breaker switch 230 inserted in the output circuit of photodiode 7. Switch 21 is controlled by a signal from a receiver 30 connected to the output of a photodiode 31 confronting the output of a third optical link 33 which, like the first and second optical links 6 and 22, is formed by an optical fiber and is irradiated at its input by a light-emitting diode 34 controlled via an amplifier 37 by a setting instruction 36. This setting instruction is also applied to a circuit 18, i.e. a programmer or timer, which controls the operation of the A/D converter 12, the register 13 and the code translator 14.

The system according to the invention is designed to increase the operating capacity of the prior-art system by enabling it to process high-energy message signals having a wide frequency range which may extend to zero at the low-frequency end, its wide band being transmitted with no particular difficulty by the selected optical link whose attenuation may vary considerably in the course of operation. Thus, my present invention is designed to provide a circuit for automatically controlling the gain of the reception channel of the system described with the object of compensating, by digital means, the variations in the received signal. It will be recalled that, in the prior art as represented by the system of FIG. 1, this circuit was controlled by means of a pilot or calibrating signal which, lying outside the frequency band of the message signal, was transmitted together with the latter. Under the conditions of signal transmission contemplated in accordance with my present invention, the calibrating signal need not lie outside that frequency band. Since the calibrating signal thus lies within the useful band, it should be transmitted independently of the message signal. When the message signal is not transmitted continuously, the transmission of the calibrating signal takes place at times when the message signal is not present. With continuous transmission the calibrating signal is transmitted at times when the message signal is deliberately blocked. The time for which the transmission of the useful signal is cut off is of the order of 10 to 20 ms which is generally admissible.

It should, however, be mentioned that the arrangement according to the invention as illustrated in FIG. 2 can still be used in places where the message signal is transmitted continuously but with a restricted bandwidth, thus enabling the calibrating signal to be transmitted continuously provided it lies outside the spectrum of the useful signal. It is then merely necessary to insert a band-pass filter 10, as in the conventional system, between the amplifier 9 and the rectifying circuit 11. This filter is shown in broken lines in FIG. 2.

In accordance with a feature of my invention, the transmission of the pilot or calibrating signal takes place periodically and automatically. For this purpose, the control signal or setting instruction 36, whose duration represents the time during which the calibrating operation is performed (a period whose duration may range from about 10 ms to several minutes or possibly hours), is applied to the amplifier 37 and thus to the LED 34. As already mentioned, the signal 36 is also applied to the timer 18 which acts as a programmer and which triggers the operation of components 12-14 of the digital AGC loop. The light signal emitted by diode 34 is transmitted by the optical link 33 to the photodiode 31 connected to receiver 30. The latter controls the changeover switch 21 which, via terminal 20, connects in circuit the source 2 generating the calibrating pulses. The sensor 1 is concurrently disconnected.

Under these conditions the calibrating signal is transmitted along the chain containing the optical link 6. It will be noted that in normal operation the breaker switch 230 is closed and changeover switch 23 engages its terminal 24. The calibrating signal, having been converted into an optical signal by the diode 4, is transmitted to the optical link 6 where it is subjected to attenuation caused by the link itself, and is reconverted by the photodiode 7 into an electrical signal, which via connection 23, 24 is applied to the fixed-gain amplifier 9. From there the signal, whose original amplitude is known, is applied to the non-clipping rectifier circuit 11.

The pilot signal is thus rectified in such a way as to preserve its amplitude and is applied to the A/D converter 12 which emits the calibrated signal in the form of a multibit word, the number of its bits depending on the desired degree of accuracy. This word is then applied to buffer register 13 and code translator 14 which, if required, changes the incoming word into a code capable of controlling the digital attenuator 15. The transcoder 14 is advantageously formed by a suitably programmed read-only memory addressable by the digital value of the calibrating signal to read out the binary word sent to the control input of the attenuator.

FIG. 3 shows a series of waveforms relating to the operation described above.

Graph (1) of FIG. 3 represents the pilot or calibrating signal Sp which is a sinusoidal wave and is converted to a DC voltage, as shown in graph (2), after passing through the non-clipping rectifier circuit 11. The digitization of the calibrating signal is controlled by a clock pulse $H_1$, graph (3), which is derived for example from the programmer 18.

Graphs (4) to (6) of FIG. 3 show the states of the output conductors of converter 12 on which the bits forming the word appear after a time $t_c$ during which the analog signal is converted into its digital counterpart. The vertical line $V_1$ in graphs (7) to (10) marks the end of the analog-to-digital conversion operation. A clock signal $H_2$, graph (7), causes the digital word representing the calibrating signal to be entered in register 13. This buffer register may be formed by bistable flip-flops which are or are not set, depending upon the voltage levels at the outputs of the analog-to-digital converter 12. The vertical line $V_2$ in graphs (7) to (10) marks the end of reading into the buffer register. Graphs (8) to (10) represent several bits of the registered attenuation-controlling word.

By way of example, the attenuator 15 may comprise a greater or lesser number of attenuating circuits, which may be T networks, formed by resistors.

Once the calibrating signal has set the attenuator 15, switch 21 changes over to terminal 19, opens the connection to generator 2 and brings sensor 1 into circuit. The message signal emitted in electrical form by the sensor takes the same path as was described above for the calibrating signal, that is to say it travels through the modulator 3, is converted into an optical signal by the light-emitting diode 4, is transmitted through the optical link 6 where it undergoes attenuation intrinsic to the link, is reconverted into an electrical signal by the photodiode 7 (circuit breaker 230 being considered closed), and is transmitted by changeover switch 23, which is in contact with terminal 24, to amplifier 9 and then to attenuator 15 which is set in the manner just stated and which emits the useful signal on its output 17.

There are, however, instances in which the message signal, converted into an optical signal, reaches a very high level of power which may be dangerous to the receiving photodiode. This is particularly so since the automatic-gain-control arrangement is situated downstream of the point at which the message signal is received by the photodiode, thus affording no protection to the latter.

In accordance with my present invention, the receiving photodiode 7 is protected by deviating the available optical power from the link 6 and thus deactivating the photodiode. The branch 22 provided for this purpose may be made, for example, by fusing the optical fiber of this link to the fiber 22 whose output supplies the second photodiode 28 which is connected to ground by a resistor 29 and is further connected to the second terminal 25 of the switch 23.

The way in which this arrangement operates is as follows. When the power of the message signal is high, it is transmitted first as a normal signal along the main optical path 6 to amplifier 9 via the photodiode 7 and the changeover switch 23 which engages its contact 24. The high-amplitude signal emitted from the output of amplifier 9 is rectified in circuit 11 and then converted into a digital word which is received by the code translator 14 but is not transmitted to attenuator 15 in the absence of control signal 36. An output of the code translator is connected to amplitude-sensing means capable of determining whether the power level of the message signal exceeds the value which the photodiode 7 is capable of withstanding, namely to the bit-by-bit comparator 38 which compares the digital word at the output of the code translator with a reference word *ref* representing, in transcoded form, the limiting level of optical power which can be accepted by the main channel 6; the comparator 38 emits a steady logic signal when this limit is exceeded. Thus, if the transmitted power is higher than this limiting value, a switchover signal issuing from comparator 38 is amplified in component 26 and energizes relay 27, thus causing breaker switch 230 to open and to disconnect the photodiode 7 while moving switch 23 from terminal 24 to terminal 25, thereby connecting the fixed-gain amplifier 9 to the photodiode 28 associated with the optical by-pass 22. The attenuation caused by the latter, as compared with that caused by the main channel 6, is such that it transmits less than the total energy received by link 6 which could be dangerous to the photodiode 28.

It may be mentioned that this manner of providing protection for the photodiode 7 is rendered possible by the fact that the bypass is switched on within a time considerably shorter than that which could destroy the photodiode and which is of the order of one second whereas the changeover time is of the order of 10 ms.

It may be assumed, by way of example, that the variable attenuator 15 situated downstream of amplifier 9 enables attenuations ranging from 0 to 15 dB in one-dB steps to be obtained. These attenuations correspond to optical attenuations ranging from 0 to 7.5 dB in steps of 0.5 dB since the optical signal produces in the photodiode a current proportional to optical power and any change in optical power expressed in decibels is equivalent to twice as many decibels in terms of the electrical signal.

It may also be assumed that the shunt channel or bypass 22 causes optical attenuation of the order of 8 dB in comparison with the main channel 6. At the beginning of the operation and with the link 6 in a satisfactory state, if the decision logic, i.e. comparator 38, connected to the code translator finds that the received message signal is too strong, it causes amplifier 9 to be switched over to terminal 25 and thus to the shunt channel, which transmits an optical signal 8 dB weaker than the useful signal at the input of channel 6. As described above, the calibrated signal from generator 2 causes the attenuation of component 15 to be adjusted whereupon the fraction of the message signal emitted by photodiode 28 is processed in the manner already described.

During subsequent operation, it may happen that the received optical signal falls off for various reasons, such for example as the aging of the link or its inherent poor quality, and decreases in power by about 8 dB. This attenuation along the shunt branch is detected by comparator 38, which cuts off the energization of relay coil 27 and causes breaker switch 230 to close, thus bringing photodiode 7 back into circuit and returning changeover switch 23 to terminal 24. Under these conditions the useful signal is again transmitted along the main channel 6.

In the above example, the attenuation caused by the secondary channel 22 as compared with that caused by the main channel 6 may be of any level less than 8 dB. In this case, the two ranges overlap. If, for example, the attenuation of the shunt channel amounts to 5 dB, the decision logic has the choice of using the main channel and applying strong electrical attenuation or using the secondary channel and applying weak electrical attenuation. The widest operating range is, however, achieved when the two attenuation levels are virtually identical, the optical attenuation exceeding the maximum electrical attenuation by a quantic increment which is 0.5 dB in the example described.

Power may thus be divided in two substantially equal parts between the two channels. The performance achieved with this solution is not as favorable, however, since when this is the case the optical signal is half as strong as when there is no division of channels. By dividing the optical signal into two parts of unequal size it is possible to retain virtually the whole of the optical power on the main channel and thus to preserve the level of performance in the worst case where the optical attenuation on the line is at a maximum.

In the described embodiment the automatic-gain-control arrangement is inserted upstream of the attenuator 15, yet the principle of the invention may also be applied when the AGC arrangement is connected downstream thereof. In that instance it is merely necessary to provide, in addition, a memory which is inserted between the code translator and the attenuator to store the previous state of the attenuator which must be taken into account.

I claim:

1. A system for conveying message signals from a transmitter to a receiver by way of a communication path, comprising:
    fiber-optical transmission means forming part of said communication path, said transmission means including a main channel extending from an input end in said transmitter to a first output end and a branch channel extending between said input end and a second output end, said branch channel having a higher optical attenuation than said main channel;
    an emitter of optical signals confronting said input end;
    a first and a second photoelectrical transducer respectively confronting said first and second output ends for translating incoming optical signals into electrical signals;
    a load circuit in said receiver;
    changeover means with a normal position and an off-normal position for respectively connecting said first and said second transducer to said load circuit; and
    amplitude-sensing means connected to said load circuit and effective in said normal position of said changeover means for switching same to said off-normal position upon detecting a signal amplitude exceeding a predetermined reference level.

2. A system as defined in claim 1 wherein said load circuit includes signal-amplifying means provided with an automatic-gain-control loop, said amplitude-sensing means being controlled by said arrangement.

3. A system as defined in claim 2 wherein said loop includes an analog-to-digital converter receiving said electrical signals from said signal-amplifying means, a transcoder supplied with binary words from said converter, and an attenuator downstream of said signal-amplifying means with a control input connected to said transcoder for adjustment of the attenuation thereof in response to said binary words, said amplitude-sensing means comprising a comparator connected to said transcoder and to a supply of a predetermined reference word representing a limiting amplitude.

4. A system as defined in claim 3 wherein said transmitter includes switch means for alternately connecting said emitter of optical signals to a source of message signals and to a source of pilot signals in response to an instruction signal from said receiver, further comprising control means in said receiver responsive to said instruction signal for enabling an adjustment of said attenuator by a binary word only upon reception of a pilot signal over said communication path.

5. A system as defined in claim 4, further comprising another fiber-optical channel extending from said receiver to said transmitter for conveying said instruction signal to said switch means.

6. A system as defined in claim 1, 2, 3, 4 or 5 wherein said main channel and said branch channel comprise respective optical fibers fused to each other at an intermediate point of said main channel.

* * * * *